United States Patent
Liaw et al.

(10) Patent No.: US 7,215,568 B2
(45) Date of Patent: May 8, 2007

(54) RESISTIVE MEMORY ARRANGEMENT

(75) Inventors: Corvin Liaw, München (DE); Thomas Roehr, Aschheim (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/215,443

(22) Filed: Aug. 30, 2005

(65) Prior Publication Data

US 2006/0050547 A1 Mar. 9, 2006

(30) Foreign Application Priority Data

Aug. 30, 2004 (DE) ...................... 10 2004 041 907

(51) Int. Cl.
*G11C 11/00* (2006.01)

(52) U.S. Cl. ...................................... 365/148; 365/100

(58) Field of Classification Search ................ 365/148, 365/100, 145, 158

See application file for complete search history.

(56) References Cited

U.S. PATENT DOCUMENTS 5,761,115 A 6/1998 Kozicki et al.
6,363,007 B1 3/2002 Lu et al.
6,456,524 B1* 9/2002 Perner et al. ............... 365/158
2004/0047219 A1 3/2004 Ito
2005/0073881 A1* 4/2005 Tran et al. .................. 365/158
2006/0050546 A1* 3/2006 Roehr ........................ 365/148
2006/0215439 A1* 9/2006 Bill et al. ................... 365/148

FOREIGN PATENT DOCUMENTS

| DE | 100 56 159 A1 | 5/2002 |
| WO | WO 02/084705 | 10/2002 |
| WO | WO 03/098636 | 11/2003 |

* cited by examiner

*Primary Examiner*—Anh Phung
(74) *Attorney, Agent, or Firm*—Dicke, Billig & Czaja, PLLC

(57) ABSTRACT

Provided is a resistive memory arrangement having a cell array structured in rows and columns and having resistive memory cells connected to a drive element for driving. Each drive element is jointly connected to n cell resistors forming a memory cell, the cell resistors being CBRAM resistance elements, in particular, and also to a writing, reading and erasing method for a resistive memory arrangement realized with CBRAM resistance elements.

15 Claims, 9 Drawing Sheets

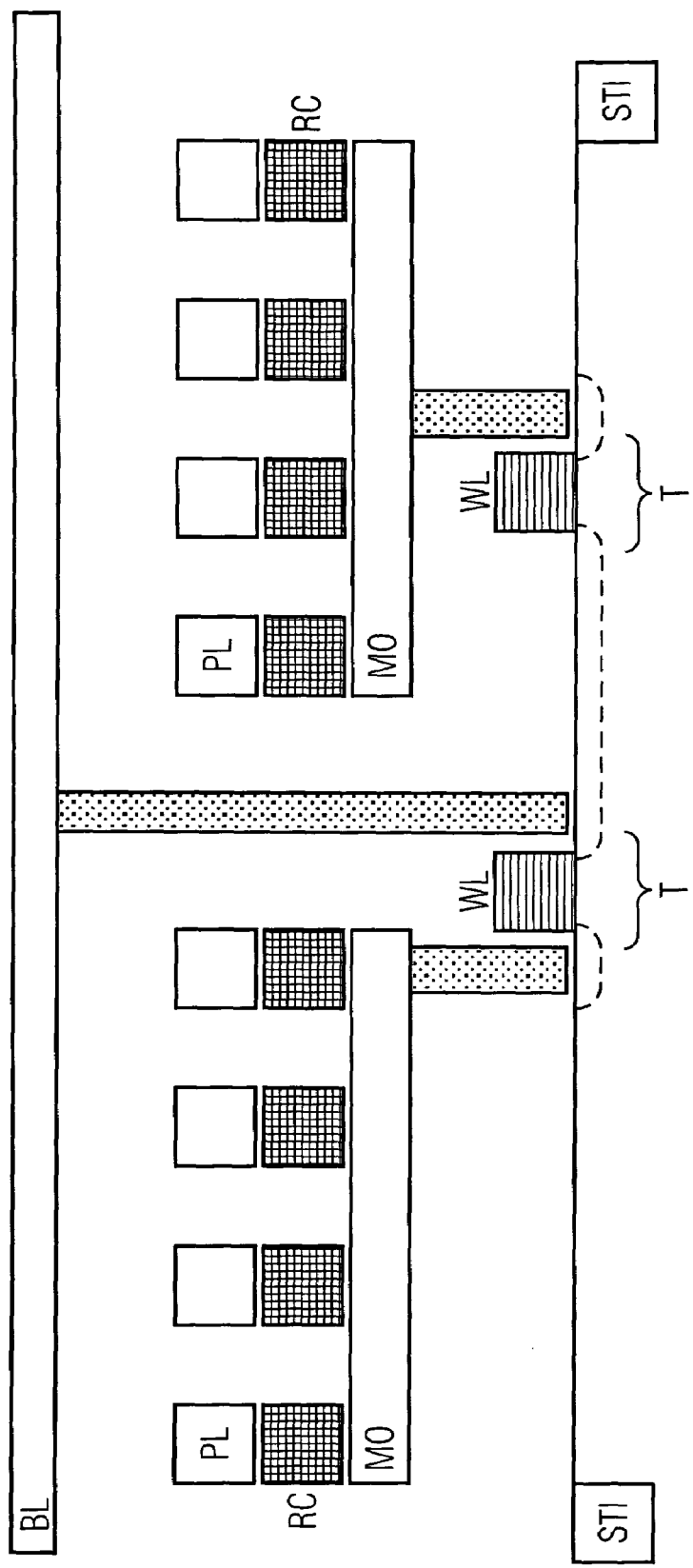

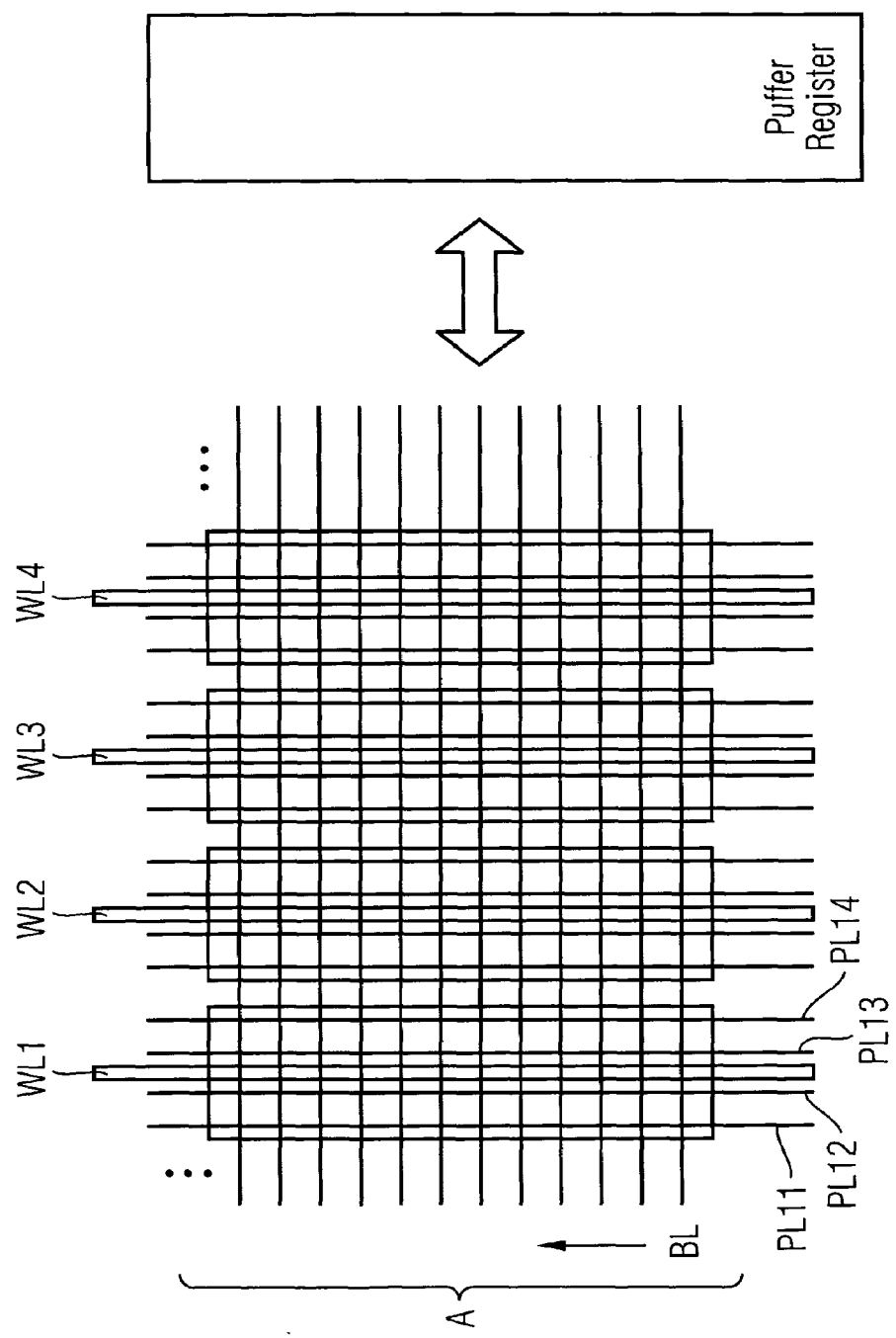

--Prior Art--

--Prior Art--

RESISTIVE MEMORY ARRANGEMENT

CROSS-REFERENCE TO RELATED APPLICATIONS

This Utility Patent Application claims priority to German Patent Application No. DE 10 2004 041 907.8, filed on Aug. 30, 2004, which is incorporated herein by reference.

BACKGROUND

The invention relates to a resistive memory arrangement having a cell array structured in rows and columns and having resistive memory cells. In particular, one embodiment of the invention relates to CBRAM resistance elements. An exemplary resistive memory arrangement is disclosed in WO 03/098636 A2. Hitherto, the memory cells of a resistive memory arrangement have been structured either in the form of a cross-point array (cf. accompanying FIG. 10) or in a 1T1R arrangement (cf. FIG. 11). FIG. 11 illustrates that each resistive memory element Rc is assigned precisely one selection or drive element T, in this case a FET, for the selection of the memory element. In the case of this circuit arrangement, the control electrode of the drive transistor T is connected to a word line WL running in the column direction and one controlled electrode of said transistor is connected to a bit line BL running in the row direction. The other controlled electrode of the drive transistor T is connected to one electrode of a CBRAM resistance element Rc, the other electrode of which is connected to a plate line PL.

WO 03/098636 A2 illustrates a possibility for combining both circuit arrangements. A further proposal for NRAM memories is set forth in WO 02/084705 A2. In the case of the memory arrangement described in the latter document, all resistance elements are connected up only to one line. The write lines are used for addressing the different resistors. Disadvantages of the cross-point arrangement in accordance with FIG. 10 are the restricted size of the memory array, the complicated read-out of the stored values and the associated delay of the read-out value. The 1T1R cell illustrated in FIG. 11 can be read faster and in a less complicated manner, but its space requirement is higher. A first compromise is the solution described in WO 03/098636 A2, in which smaller cross-point arrangements are connected up (arranged vertically). The main emphasis of this compromise is placed on the smaller space requirement which is effected at the expense of speed. The solution proposed in WO 02/084705 A2 is slow on account of two read cycles and, since a write line is used, is suitable only for MRAM memory arrangements.

SUMMARY

One embodiment of the invention avoids the above mentioned disadvantages of the cross-point arrangement and of the 1T1R arrangement that are present in the prior art and improves the resistive memory arrangement outlined in the introduction in such a way that each memory cell thereof has only a small space requirement, permits fast access and crosstalk and interference voltages acting on it are made harmless.

In one embodiment of the present invention, n cell resistors that together form a memory cell are connected to a drive element, for example, a FET. The various cells are then addressed via the word lines which control the drive transistors, the bit lines and the plate lines, which are now embodied separately for each resistance element at the transistor.

One embodiment of the invention includes a resistive memory arrangement in which each drive element is jointly connected to n cell resistors forming a memory cell, which is characterized in that the control electrodes of the drive elements of a column are jointly connected to a word line running in the column direction and the first controlled electrodes of the drive elements of a row are jointly connected to a bit line running in the row direction and moreover the second controlled electrodes of each drive element are in each case connected to the first electrodes of the n cell resistors and the second electrodes of the n cell resistors of each column are individually connected in each case to a plate line running in the column direction. A memory cell of this type is referred to hereinafter as a 1TnR cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 illustrates a cross section through an exemplary embodiment of a resistive memory arrangement according to one embodiment of the invention with four cell resistors per drive transistor, in which two possibilities for positioning the drive transistor are illustrated.

FIG. 8 schematically illustrates a detail from a cell array with a buffer register for elucidating a page mode.

DETAILED DESCRIPTION

Figure 1:
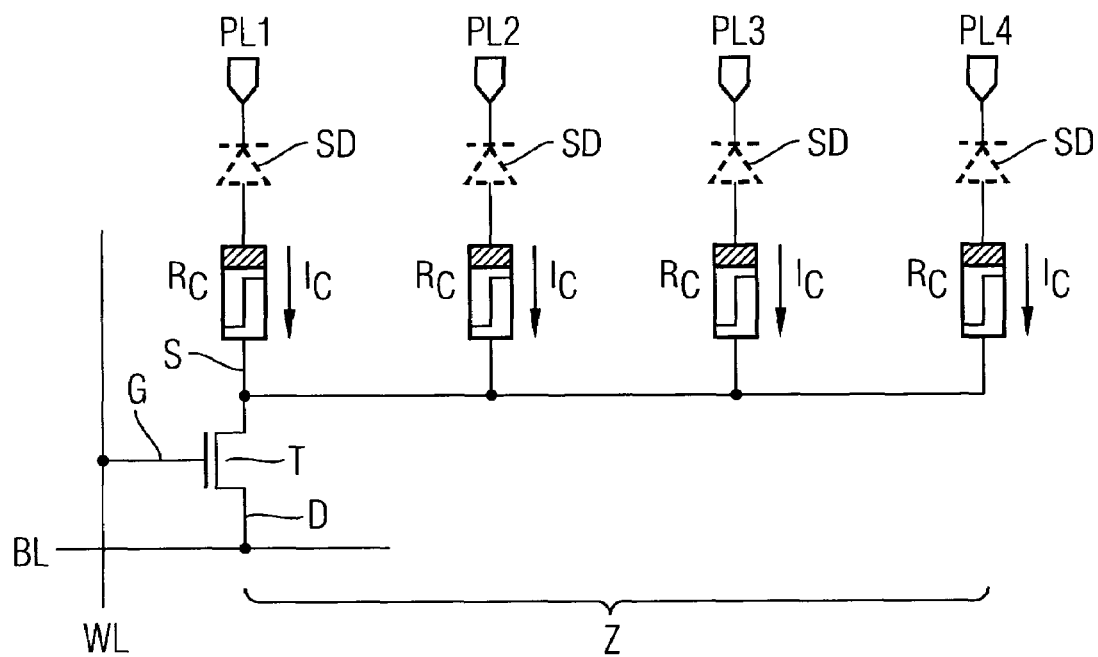
FIG. 1 illustrates a circuit diagram of a cell of a cell array of a resistive memory arrangement according to one embodiment of the invention, which cell has four CBRAM resistance elements by way of example.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although the cell resistors are CBRAM resistance elements in the exemplary embodiments described, the present resistive memory arrangement can also be realized with polymer memory cells or other resistive memory cells.

In the case of the CBRAM resistance elements having an asymmetrical characteristic, their anodes are connected to the plate lines and their cathodes are connected to the drive element. In order to avoid writing and erasing errors, a diode may be in each case connected in the forward direction or in the breakdown direction in series with the CBRAM resistance elements.

In one exemplary embodiment, each memory cell contains n=4 cell resistors.

In accordance with one embodiment, the invention specifies a method for writing to a CBRAM resistance element of a resistive memory arrangement of this type. According to the method, the word line of the corresponding memory cell is opened, and all plate lines and bit lines of unselected resistance elements are put at a specific plate potential. Furthermore, the plate line voltage of the selected resistance element is increased by a write voltage $\Delta$Vwrite of approximately 150 mV to VPL+$\Delta$Vwrite and the voltage of the associated bit line is decreased by the write voltage to VPL−$\Delta$Vwrite.

For parallel writing to a plurality of resistance elements on the selected plate line, the bit line voltage of a plurality of bit lines may be decreased by the write voltage $\Delta$Vwrite.

In the case of the diode interposed in series with the CBRAM resistance elements, the respective voltages to be applied are increased, depending on the polarity of the diode, by the forward or breakdown voltage thereof.

In accordance with one embodiment, the invention specifies a method for reading a CBRAM resistance element of a resistive memory arrangement in current sensing operation. According to the method, the word line of the corresponding memory cell is opened and the bit line voltage of the selected memory cell is held at a specific plate potential. Furthermore, the voltage on the plate line of the resistance element to be read is put at a read voltage lying approximately 100 mV above the plate potential, all plate lines and bit lines of nonselected resistance elements being held at plate potential and a sense current flowing through the resistance element being detected in accordance with the programming state thereof.

For parallel reading of a plurality of resistance elements which lie on the same word line or bit line, said resistance elements are connected in parallel to a sense circuit, and the remaining bit lines are held at plate potential in this case.

In accordance with one embodiment, this invention specifies a method for erasing a CBRAM resistance element of a resistive memory arrangement. According to the method, the word line corresponding to the memory cell with the resistance element to be erased is opened, and all plate lines and bit lines of unselected resistance elements are put at a specific plate potential. Furthermore, the plate line voltage of the selected resistance element is reduced by a specific erase voltage $\Delta$Verase to VPL−$\Delta$Verase and the voltage of the associated bit line is increased by the erase voltage to VPL+$\Delta$Verase.

In the case where the diode is used in series with the CBRAM resistance elements, the respective voltages to be applied are increased, depending on the polarity of the diode, by the forward or breakdown voltage thereof.

In accordance with one embodiment, the invention specifies a method for parallel erasure of all resistance elements connected to a drive element along a word line. According to the method, the word lines corresponding to the memory cells with the resistance elements to be erased are opened, and all plate lines and bit lines of unselected resistance elements are put at a specific plate potential. Furthermore, the voltages on the plate lines of the selected cells are held at the plate line potential and the voltage on the bit lines of the selected cells is increased by a specific erase voltage.

In the case of the resistive memory arrangement according to one embodiment of the invention, in the cell array n cell resistors forming a memory cell are connected to a drive transistor. This arrangement is called 1TnR memory arrangement for short hereinafter.

FIG. 1 illustrates one exemplary embodiment of a resistive memory arrangement, in which four CBRAM resistance elements Rc are connected to a field effect drive transistor T and form a 1T4R memory arrangement. Expedient other arrangements are, for example, the 1T2R, 1T8R, 1T16R memory arrangements. The number n of cell resistors Rc connected to the one drive transistor T is essentially dependent on the addressing, writing, reading and erasing scheme. In the case of the memory arrangement illustrated in FIG. 1, the control electrodes G of the drive elements (field-effect transistor) T of a column are jointly connected to a word line WL running in the column direction and the first controlled electrodes D of the drive elements T of a row are jointly connected to a bit line BL running in the row direction, and the second controlled electrodes S of each drive element T are in each case connected to the first electrodes of the n cell resistors Rc and the second electrodes of the n cell resistors Rc of each column are individually connected in each case to a plate line PL1−PLn; PL11, PL12, PL13, PL14 running in the column direction. In a simplified illustration, FIG. 1 illustrates only one cell Z of the entire cell array, that is to say that this arrangement is repeated along the parallel word lines WL running in the column direction and the plate lines PL likewise running in the column direction. The arrangement is equally continued in the row direction along the bit line BL (also see the layout in FIG. 4). The various cells are addressed via the word line WL which controls the drive transistor T, the bit line BL and the plate lines PL1−PL4, which is embodied separately here for each CBRAM resistor Rc connected to the transistor T.

The functioning is explained below on the basis of the asymmetrical CBRAM resistor. In FIG. 1, this asymmetry is manifested at the special resistor symbol in which the anode is on the side of the thick line. However, the arrangement can also be used for resistors with a suitable symmetrical characteristic.

Figure 2:
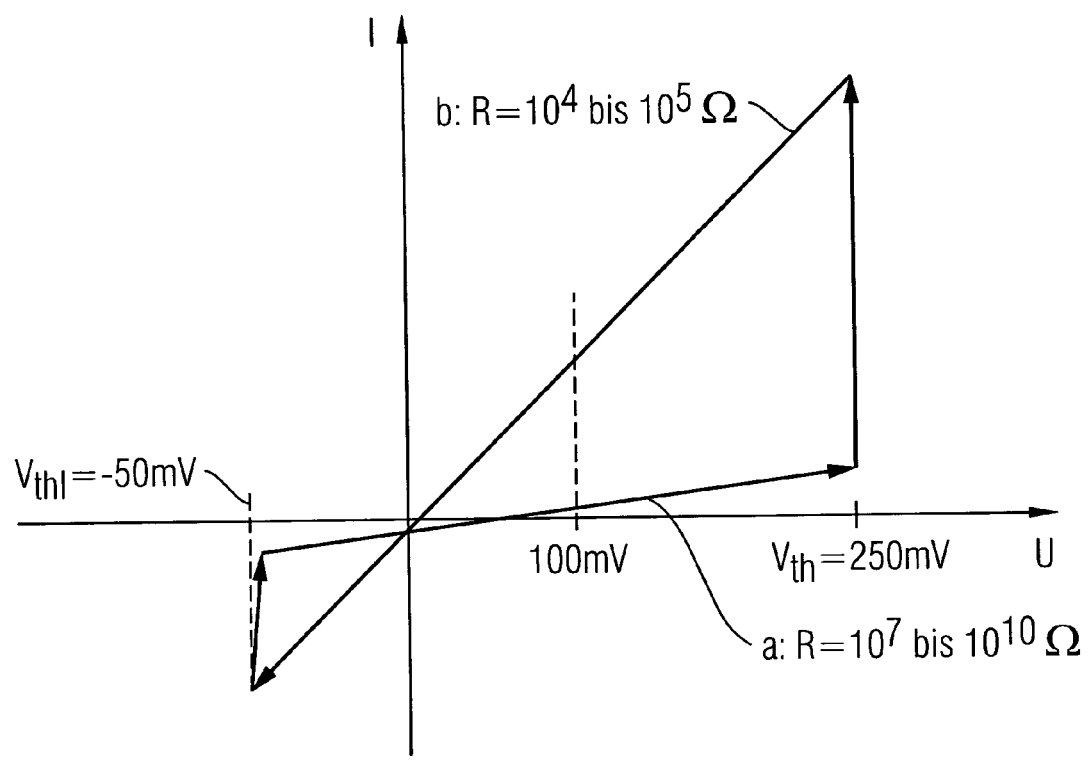
FIG. 2 graphically illustrates a cell characteristic of the CBRAM resistance element.

The characteristic curves of the CBRAM resistance element are illustrated graphically in FIG. 2. The resistor originally has a high resistance and depending on the embodiment has a value of $10^7$ to $10^{10}$ Ω (characteristic curve branch a). If the voltage U is increased in the positive direction (anode at the positive pole and cathode at the negative pole), the resistor switches to the low-resistance state starting from a writing threshold voltage Vth of approximately 250 mV and then has approximately $10^4$ to $10^5$ Ω (characteristic curve branch b). At negative voltage–U, the resistor can be set into the high-resistance state again in accordance with FIG. 2. During reading, the resistor is evaluated at approximately 100 mV in the positive direction. In this operating state, it is possible, for example, to evaluate the current Ic through the resistance element Rc (cf. FIG. 1).

A method for writing to a CBRAM resistance element Rc of a 1TnR memory arrangement, the associated problems and possible solutions are described below. In order to write to a resistor, the word line WL of the cell Z is opened. All plate lines PL and bit lines BL for unselected resistors are at the plate potential VPL. In order to write to the selected resistor, the plate line PL thereof is increased by ΔVwrite (potential: VPL+ΔVwrite) and the associated bit line BL is decreased by ΔVwrite (potential VPL–ΔVwrite). Consequently, twice ΔVwrite is present at the resistor to be written to and ΔVwrite is present at all resistors of the opened word line WL. If ΔVwrite is equal to 150 mV, the selected cell is written to with a voltage of 300 mV. The remaining resistors Rc retain their original value since the voltage present does not suffice for writing. If a plurality of bit lines BL are put at –ΔVwrite, a plurality of resistors Rc on the selected plate line PL can be written to in parallel.

If the writing threshold voltage Vth has a distribution, that is to say that it does not have only an individual value (of e.g. 250 mV), rather, for example, threshold voltage values of between Vthmax=350 mV and Vthmin=150 mV occur, so-called write disturbs (cells that are not intended to be written to are written to) or so-called "write failures" (cells to be written to are not written to since the voltage does not suffice) may occur. A diode SD—depicted by broken lines in FIG. 1—in series with the resistance elements Rc (biased in the forward direction or breakdown direction) can eliminate this problem since the condition 0.5 Vth>Vthmin is now to be applied to the threshold voltage of the diode D plus the write voltage. The following holds true:

$$2 \times \Delta V\text{write} > V\text{th max} + V\text{diode}$$

$$\Delta V\text{write} < V\text{th min} + V\text{diode}.$$

This results in $V\text{diode} > V\text{th max} - V\text{th min}$.

Depending on how the diodes SD are biased, they have to be operated at breakdown for writing and reading or for erasing operations. The voltages to be applied are in each case increased by the diode voltage (either forward voltage or breakdown voltage).

Figure 3:
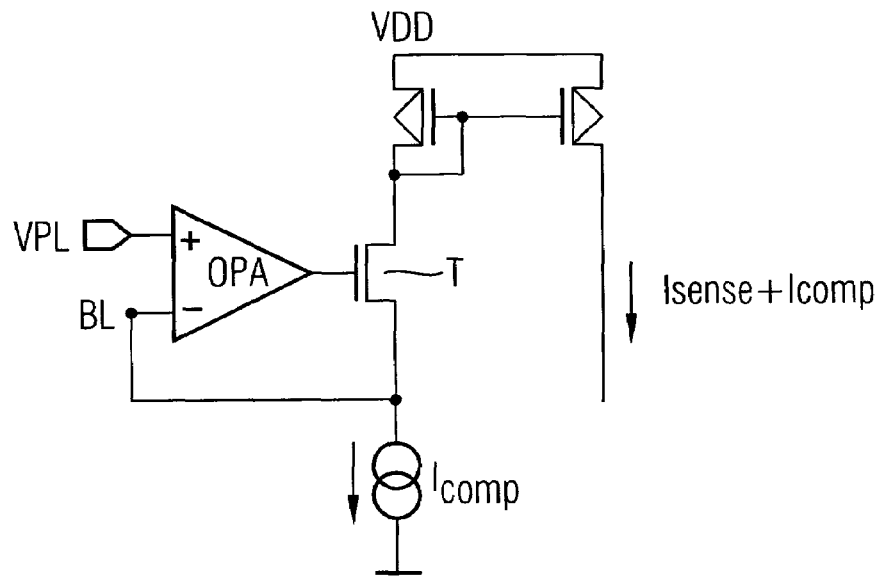
FIG. 3 illustrates a circuit arrangement for elucidating the reading method according to one embodiment of the invention.

A method for reading a CBRAM resistance element Rc, the problems that occur in this case and possible solutions thereto are furthermore described. When reading a CBRAM resistor Rc, the corresponding word line WL of the cell Z is opened. By means of an operational amplifier OPA, as can be seen in FIG. 3, the voltage of the bit line BL of the selected cell Z is held at plate line potential VPL. If the plate line PL of the cell to be read is then put at a read voltage Vread, a voltage approximately 100 mV above the plate line voltage VPL, the current of the cell can be sensed (normal current sensing). In this case, all plate lines PL and bit lines BL of nonselected resistors are to be held at plate line potential VPL in order to minimize the parasitic currents. Since the operational amplifier OPA does not regulate exactly to VPL but rather to a value VPL+/–Voffset, the resultant parasitic current limits the number of resistance elements Rc that can be connected to a drive transistor T. If a plurality of bit lines BL are connected to a sense circuit in this way, then a plurality of resistors can be read in parallel. However, these resistors must lie on the same word line WL and plate line PL as the rest of the resistors read. The remaining bit lines BL should be held at VPL even if they are not being read.

A method according to one embodiment of the invention for erasing resistors, the problems that occur in this case and possible solutions are furthermore described. In order to erase an individual CBRAM resistance element, the negative erasing threshold voltage Vth1 of approximately –50 mV has to be applied across it (cf. FIG. 2). The corresponding word line WL is opened for this purpose. In the case of unselected resistance elements Rc, the bit line BL and plate line PL are at plate line potential VPL. In a manner similar to that when writing, voltages are now applied (only this time with opposite signs). The selected plate line is thus put at VPL–ΔVerase and the bit line at VPL+ΔVerase. As in the case of writing, the voltage ΔVerase at the nonselected resistors does not suffice to erase the latter, while 2×ΔVerase suffices at the selected resistance element Rc. In the same way as when writing, erase disturbs and erase failures may occur on account of a threshold voltage distribution. In addition to the possibility of using a diode SD (FIG. 1), it is also possible to use a so-called block erase in order to avoid erase disturb and erase failures. In this case, all resistance elements Rc connected to a drive transistor T (all cells) along a word line WL are erased. The plate lines PL are then held at VPL and the corresponding bit lines BL are increased by the necessary voltage value.

Figure 4:
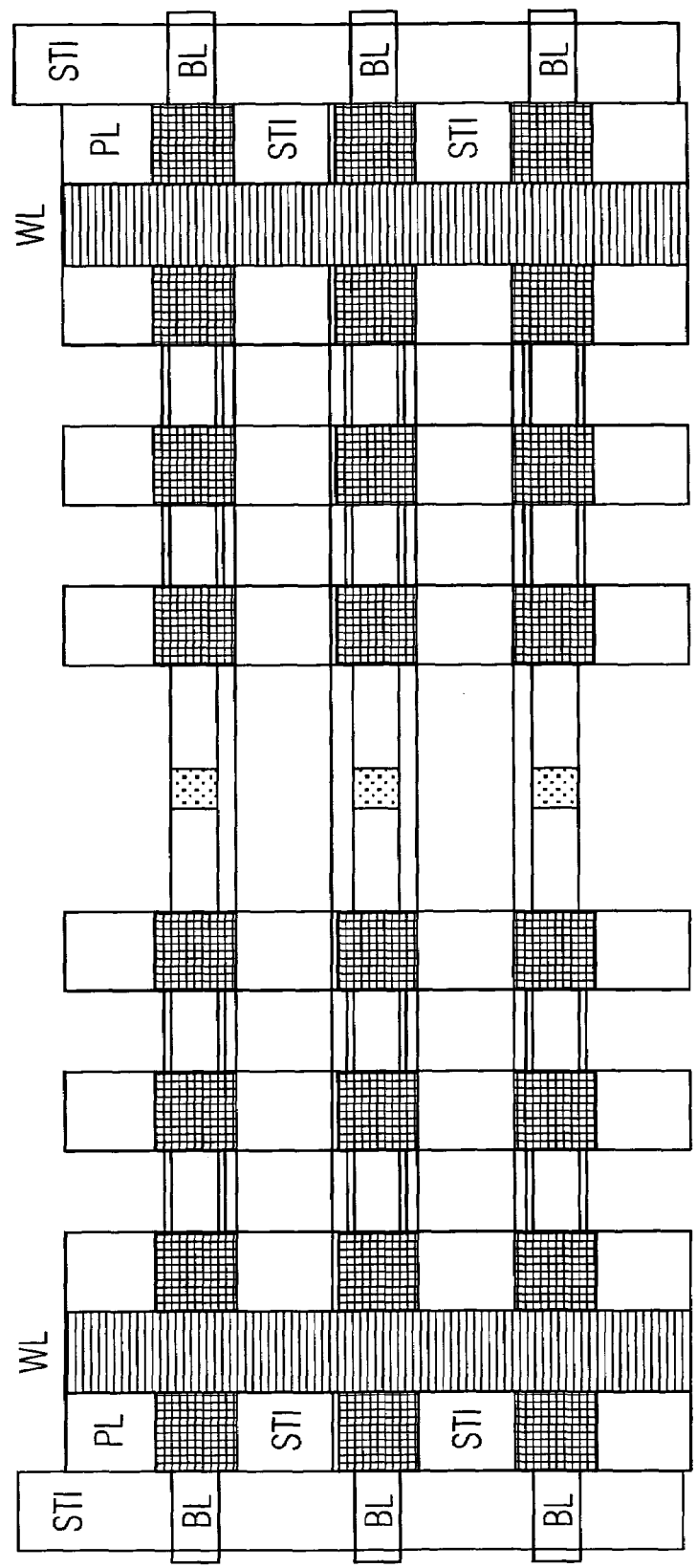
FIG. 4 illustrates a layout of an exemplary embodiment of a resistive memory arrangement according to one embodiment of the invention with four cell resistors per drive transistor.
Figure 5:
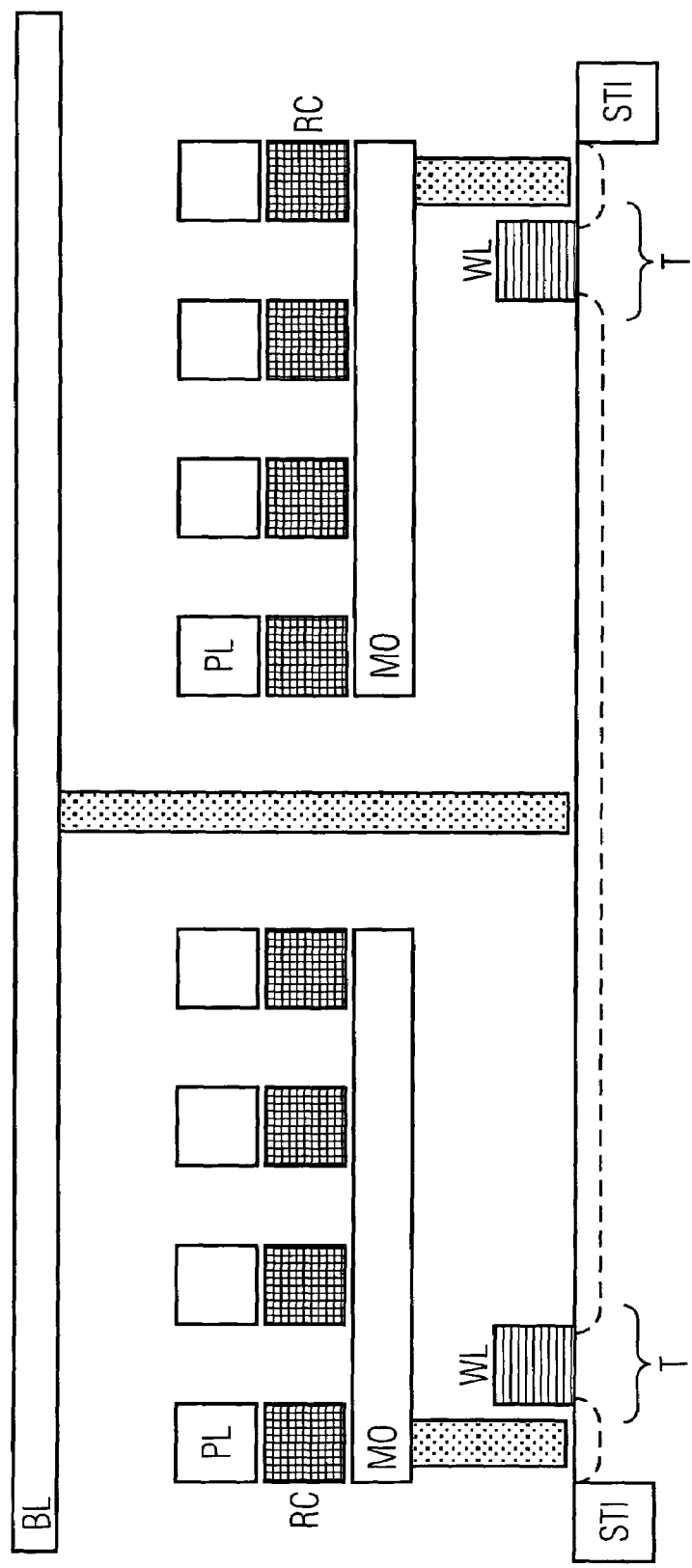
FIG. 5 schematically illustrates a cross section through the memory arrangement illustrated in layout form in FIG. 4.

FIG. 4 schematically illustrates a layout of a 1T4R memory arrangement, and FIG. 5 illustrates a schematic cross section with respect thereto. This layout of the 1T4R memory arrangement is symmetrical with respect to centrally located bit line contact plugs to the drain electrode of the selection transistors T. The 1T4R arrangement illustrated in FIGS. 4 and 5 is laterally isolated from adjacent 1T4R memory arrangements by a shallow trench isolation oxide STI. FIG. 6 illustrates a cross section through a further exemplary embodiment of an (asymmetrical) 1T4R memory arrangement, which illustrates two possibilities for positioning the drive transistor T. In this case, either the diffusion resistance (FIG. 6 left) or the symmetry with respect to metal M0 (FIG. 6 right) is optimized.

Figure 7:
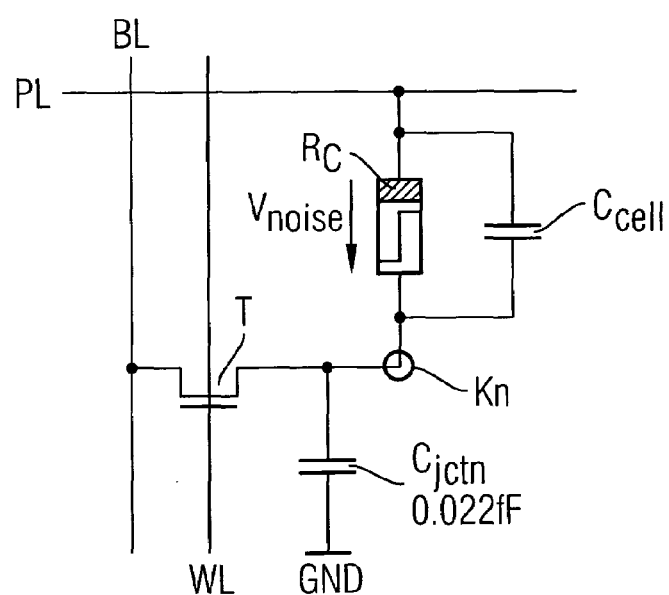
FIG. 7 illustrates a circuit diagram for elucidating the capacitive coupling in of interference voltages in a CBRAM resistance element.

A specific problem that occurs in CBRAM resistance elements is the coupling in of interference voltages at the circuit node Kn between a (high-resistance) resistance element Rc and the drive transistor T. Since the resistance of the CBRAM resistance element Rc has a value of up to $10^{10}$ Ω in the high-resistance state, the node Kn is practically isolated in the off state of the transistor T. As can be seen in FIG. 7, interference voltages Vnoise can then be coupled capacitively onto the node Kn. These interference voltages may be problematic since the resistance elements, on account of the low threshold voltages, may thereby be programmed or erased in an undesirable manner. In order to prevent this, the 1TnR arrangement according to one embodiment of the invention with a plurality of parallel resistance elements Rc is advantageous on account of the low-resistance nature of the parallel circuit. One arrangement consists in programming a resistance element of the memory cell specifically to a suitable low-resistance value (possible in the case of CBRAM by programming with different currents). This rapidly compensates for an interference voltage that builds up, without causing a write or erase disturb. The plate lines PL of the resistance elements Rc at a drive transistor T can be short-circuited, for example, in the quiescent state.

One mode for operating a 1TnR memory arrangement described above is for the various plate lines PL1, PLn (for example, PL1–PL4) of a cell Z to be read successively (in each case one plate line in parallel) by means of a counter and to effect storage in a buffer register. Such a block can then be interpreted as a page. This page can also be written to plate line by plate line and be erased all at once (see the block erase method described above). This increases the speed of the processes and the achievable bandwidth since it is only ever necessary for a few lines to be subjected to charge reversal. One example of such a page mode is illustrated schematically in FIG. 8. By way of example, in FIG. 8, the word line WL1 is activated, and a counter successively drives the plate lines PL11 to PL14. The data are buffer-stored in a buffer register and can be output as an entire page. A page is written in the same way: the externally arriving data are buffer-stored in the buffer register. After the activation of the corresponding word line WL, the data are written, for example, beginning with plate line PL11. PL12, PLi3 and PL14 then follow. All resistance elements that are situated on a word line, for example, WL1, are erased in this mode. Thus, for example, the word line WL1 can be opened. The plate lines PL11 to PL14 connected to these cells are at the voltage VPL.

Figure 9:
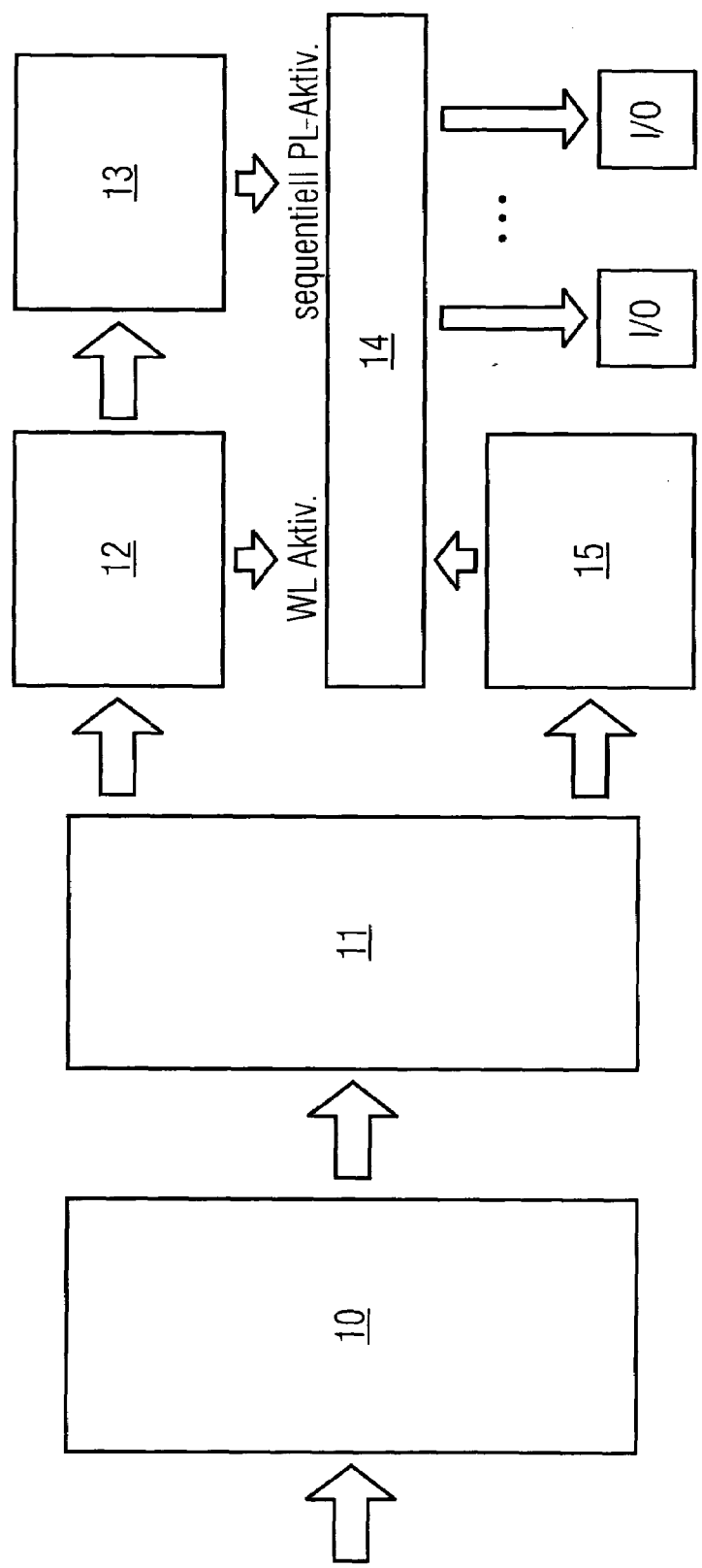
FIG. 9 illustrates a block diagram for elucidating an addressing path.
Figure 10:
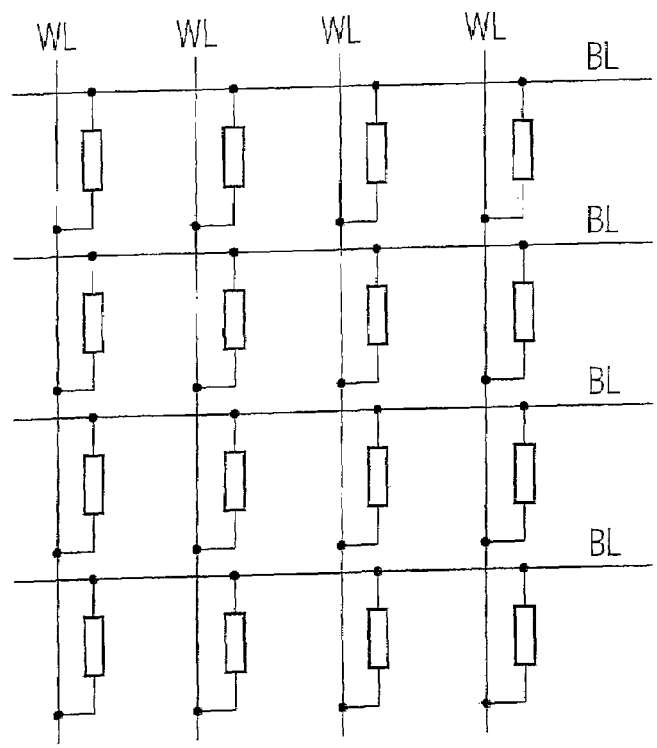
FIG. 10 illustrates the cross-point array arrangement explained in the introduction.
Figure 11:
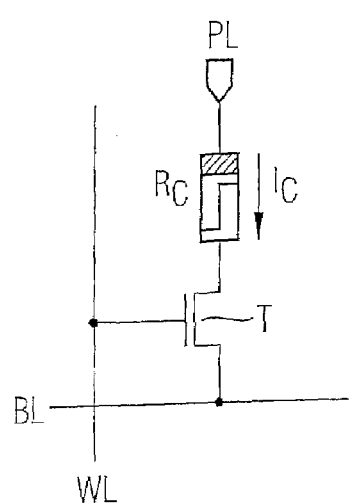
FIG. 11 illustrates the 1T1R arrangement likewise explained in the introduction.

FIG. 9 illustrates an exemplary address path for a resistive memory arrangement according to one embodiment of the invention in the form of a block diagram. The address in an external address and command register 10 is loaded into an address decoder 11. A word line decoder 12 drives the corresponding word lines WL and the counter 13 drives the plate lines PL successively. The bit line decoder 15 drives the correct bit lines BL and the data thus read are loaded into the associated buffer register 14. A relatively large burst can thus be read out via the I/O pads. For writing, the direction of the data path is simply changed, and the data arriving from the I/O pads are written to the location in the cell array that is determined by the addressing logic illustrated in FIG. 9.

Note: CBRAM is a designation usually used by the applicant (CBRAM=Conductive Bridging RAM). The designation PMC (Programmable Metallization Cell) is often used in the literature.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for writing to a CBRAM resistance element of a resistive memory arrangement having a cell array structured in rows and columns with resistive memory cells connected to a drive element, each drive element jointly being connected to a plurality of CBRAM resistive elements forming a memory cell, the method comprising;
    opening a word line of a corresponding memory cell;
    placing all plate lines and bit lines of unselected resistance elements at a specific plate potential;
    increasing the plate line voltage of a selected resistance element by a specific write voltage; and
    decreasing the voltage of an associated bit line by the write voltage.

2. The method of claim 1, further including decreasing the bit line voltage of a plurality of bit lines by the write voltage for parallel writing to a plurality of resistance elements on the selected plate line.

3. The method of claim 2, wherein a diode is connected in series with the CBRAM resistance elements, the method further including increasing the write voltage.

4. The method of claim 3, wherein the diode is forward biased, and wherein the write voltage is increased by the forward bias voltage of the diode.

5. The method of claim 3, wherein the diode is breakdown biased, and wherein the write voltage is increased by the breakdown voltage of the diode.

6. The method of claim 1, wherein the write voltage is about 150 mV.

7. A method for reading a CBRAM resistance element of a resistive memory arrangement having a cell array structured in rows and columns with resistive memory cells connected to a drive element, each drive element jointly being connected to a plurality of CBRAM resistive elements forming a memory cell, the method comprising:
    opening a word line of a corresponding memory cell;
    holding the voltage of a bit line of a selected memory cell at a specific plate potential;
    placing the voltage on a plate line of a resistance element to be read at a specific read voltage;
    holding all plate lines and bit lines nonselected resistance elements at the plate potential; and
    detecting a sense current flowing trough the resistance element in accordance with a programming state thereof.

8. The reading method of claim 7, further including holding additional bit lines at plate potential for parallel reading of a plurality of resistance elements lying on the same word line and plate line connected in parallel to a sense circuit.

9. The method of claim 7, wherein the read voltage is approximately 100 mV above the plate potential.

10. A method for erasing a CBRAM resistance element of a resistive memory arrangement having a cell array structured in rows and columns with resistive memory cells connected to a drive element, each drive element jointly being connected to a plurality of CBRAM resistive elements forming a memory cell, the method comprising:
    opening a word line corresponding to a memory cell with a resistance element to be erased;
    placing all plate lines and bit lines of unselected resistance elements at a specific plate potential;
    reducing a plate line voltage of the selected resistance element by a specific erase voltage; and
    increasing the voltage of the associated bit line by the erase voltage.

11. The method of claim 10, wherein a diode is connected in series with the CBRAM resistance elements, the method further including increasing the erase voltage.

12. The method of claim 11, wherein the diode is forward biased, and wherein the write voltage is increased by the forward bias voltage of the diode.

13. The method of claim 11, wherein the diode is breakdown biased, and wherein the write voltage is increased by the breakdown voltage of the diode.

14. A method for operating a resistive memory amusement having a cell array structured in rows and columns with resistive memory cells connected to a drive element, each drive element jointly being connected to a plurality of CBRAM resistive elements forming a memory cell, the method comprising:
- activating a word line of a column;
- driving plate lines of the column which are connected to cell resistors of the resistive memory cells successively by means of a counter, in that, during a reading process, information of the successively driven cell resistors of the memory cells of the column is read out via bit lines and buffer-stored in a buffer register and output as an entire page; and
- during a writing process, externally arriving write data of a page are buffer-stored in the buffer register, the corresponding word line of a column is activated and the write data buffer-stored in the buffer register are written sequentially, beginning with the first plate line up to the last plate line, to the cell resistors of the memory cells of the column.

15. A method for parallel erasure of all resistance elements connected to a drive element along a word line in a resistive memory arrangement having a cell array structured in rows and columns with resistive memory cells connected to a drive element, each drive element jointly being connected to a plurality of CBRAM resistive elements forming a memory cell, the method comprising:
- opening word lines corresponding to the memory cells with the resistance elements to be erased;
- placing all plate lines and bit lines of unselected resistance elements at a specific plate potential;
- holding the voltages on plate lines of the selected cells at the plate potential; and
- increasing the voltage on the corresponding bit lines by a specific erase voltage.

* * * * *